Oct. 13, 1970 H. WEINERTH 3,534,232

SEMICONDUCTOR DEVICE WITH AREAL PN-JUNCTION

Filed June 27, 1968 3 Sheets-Sheet 1

INVENTOR

HANS WEINERTH

BY Philip M. Bolton

ATTORNEY

Oct. 13, 1970 H. WEINERTH 3,534,232

SEMICONDUCTOR DEVICE WITH AREAL PN-JUNCTION

Filed June 27, 1968 3 Sheets-Sheet 2

INVENTOR

HANS WEINERTH

BY Philip M. Bolton

ATTORNEY

Oct. 13, 1970 H. WEINERTH 3,534,232

SEMICONDUCTOR DEVICE WITH AREAL PN-JUNCTION

Filed June 27, 1968 3 Sheets-Sheet 3

INVENTOR

HANS WEINERTH

BY Philip M. Bolton

ATTORNEY

United States Patent Office 3,534,232
Patented Oct. 13, 1970

3,534,232
SEMICONDUCTOR DEVICE WITH AREAL PN-JUNCTION

Hans Weinerth, Eindhoven, Woensel, Netherlands, assignor to International Standard Electric Corporation, New York, N.Y., a corporation of Delaware Filed June 27, 1968, Ser. No. 740,763
Claims priority, application Germany, Aug. 3, 1967, 1,589,693
Int. Cl. H01l 3/00
U.S. Cl. 317—234 3 Claims

ABSTRACT OF THE DISCLOSURE

A more accurately controlled Zener breakdown voltage is obtainable in a planar device by controlling the uniformity in impurity concentration in a region where breakdown voltage occurs. Voltage breakdown occurs in an intermediate region which is sandwiched between a highly doped substrate and a weakly doped surface layer. This intermediate layer is doped with arsenic and the highly doped substrate is doped with phosphorus.

BACKGROUND OF THE INVENTION

This invention relates to Zener diodes which have improved voltage breakdown characteristics. It is well-known that, in the manufacture of silicon mono-crystals, in particular according to the crucible-pulling method, there appear almost periodic fluctuations of the doping concentrations. In a section rectangular in relation to the pulling direction of the crystal, these inhomogeneities which, in the English professional literature, are referred to as "striations," are noticed by a bark-type doping structure in the shape of stripes. When manufacturing from such a silicon slice e.g. Zener diodes then chiefly three disadvantages are caused by the doping fluctuations.

In the case of pn-junctions according to FIG. 1 of a relatively large area in comparison to the dimensions of the stripes or striations there is first of all only effected a break-through in the reverse direction of the highest doped areas 1 of the pn-junction. When increasing the applied inverse voltage there are increasingly affected also areas of a weaker doping concentration. Zener diodes with pn-junctions according to FIG. 1, in distinction to homogeneously doped diodes, show an increased differential resistance in the break-down (cf. e.g. Shockley, Prague 1960).

In the case of relatively small-surface elements (diameter of the pn-junction small with respect to the width of striae) there does not appear the disadvantage as mentioned above. Instead of this there is obtained, in accordance with the doping variation, a scattering of the break-down voltage values $U_z$ of the pn-junctions throughout the diameter $d$ of a semiconductor wafer, as is shown in FIG. 4. This scattering represents a considerable disadvantage with respect to the aimed manufacture of Zener diodes or other semiconductor elements in which it is strived to obtain a defined break-down voltage.

In the case of highly doped silicon, for example, it is possible that in areas of a maximum doping concentration, the maximum solubility $C_L$ of the doping substance in the silicon may already be exceeded, as is illustrated in FIG. 3 by the shaded portion of the area below the curve of the doping concentration C. At such points there appear dot- or line-shaped precipitations of the doping substance which, in the course of subsequently following temperature processes, act as doping sources. Semiconductor elements with such phenomena, preferably show double bends in the reverse characteristic relating to the involved pn-junction according to FIG. 5.

According to experiences, not all doping substances, in particular of the series P-As-Sb, show an equally well distinguished striation character. Especially antimony shows particularly strong inhomogeneities. In the manufacture of planar-Zener diodes with an epitaxial surface passivation by means of a weakly doped surface layer, however, there is usually used just an antimony doping for the semiconductor material which is determinative of the break-down voltage. The reason for this is to be seen in that phosphorus, owing to its high diffusion coefficient, and arsenic, owing to its high steam pressure, are excluded from being considered as doping materials.

SUMMARY OF THE INVENTION

It is an object of this invention to obtain semiconductor devices having improved electrical characteristics. The present invention relates to a semiconductor device with areal pn-junction in a monocrystalline seminconductor body between a p-doped surface zone extending through a weakly n-doped surface layer into a more highly n-doped intermediate layer on a very highly n-doped substrate. The above-mentioned disadvantages of semiconductor devices with areal pn-junction are avoided, according to the invention, in that the doping of the intermediate layer between the surface layer and the substrate, which is determinative of the break-down voltage within the barrier area of the pn-junction, consists of arsenic, and that the doping of the substrate consists of phosphorus.

DESCRIPTION OF THE PREFERRED EMBODIMENT

Figure 1:
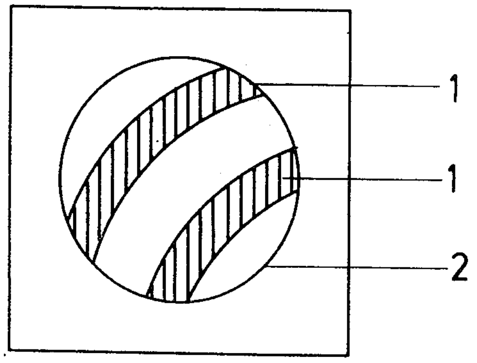
FIGS. 1 and 2 show a top and cross-sectional view respectively, of a planar diode with a pn-junction having the shape of a circular surface, with a diameter of about 1 mm.
Figure 2:
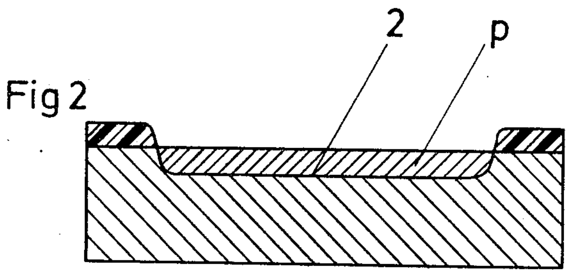
Figure 3:
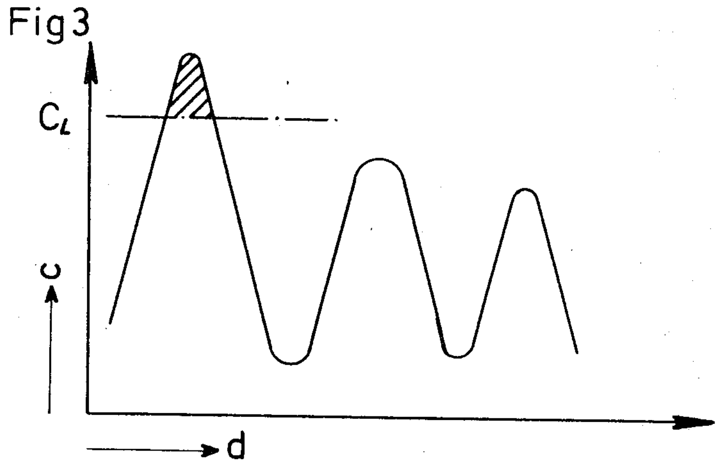
FIG. 3 shows the solubility of doping substances in silicon.
Figure 4:
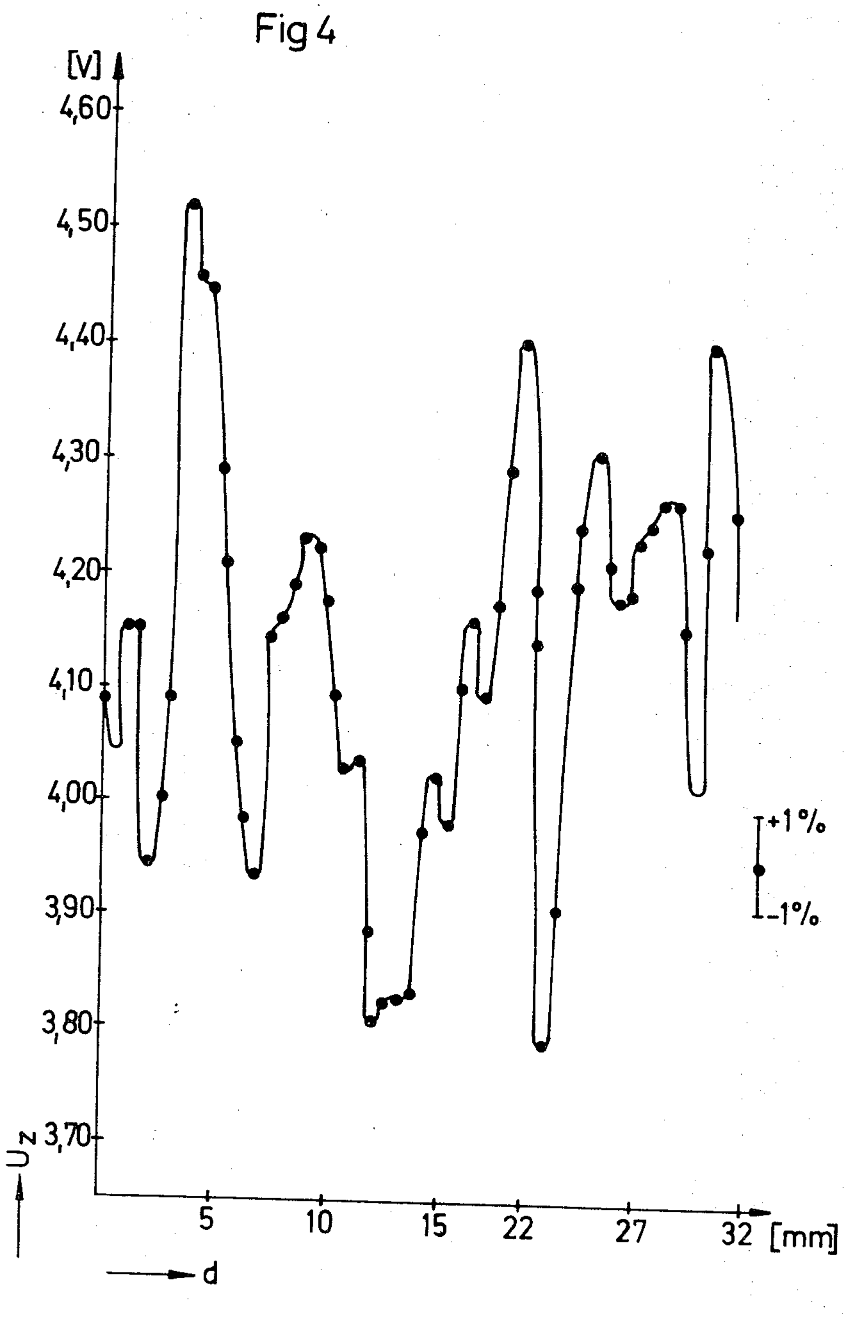
FIG. 4 shows a scattering of the break-down voltage values $U_z$ of the pn-junction throughout the diameter $d$ of a semiconductor wafer.
Figure 5:
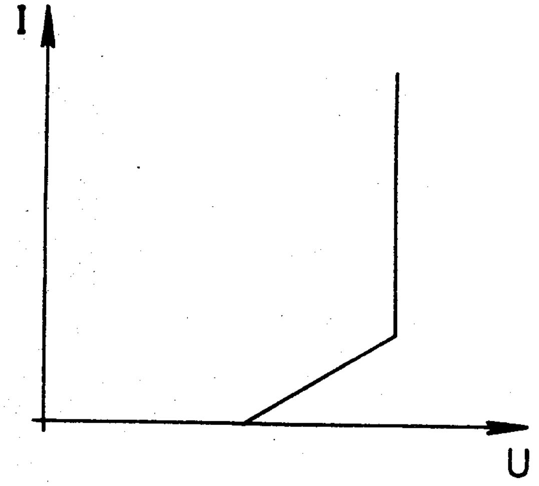
FIG. 5 shows the break-down voltage characteristics of a highly doped silicon Zener diode.
Figure 6:
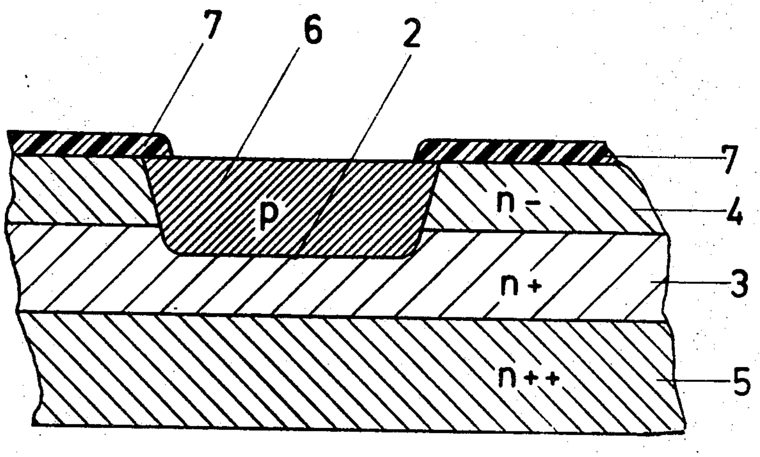
FIG. 6 shows a planar Zener diode having the characteristics of this invention.

Appropriately, in FIG. 6, the intermediate layer 3 which is determinative of the break-down voltage, is applied epitaxially as a substrate on a silicon base body 5 which is doped with phosphorus up to saturation. The intermediate layer 3 which is doped with arsenic, is coated in the known manner, likewise by way of epitaxy, with an $n^{--}$surface layer 4. The subsequently following planar diffusion for manufacturing the p-doped surface zone 6 through the masking layer 7 is to be controlled in such a way that the diffusion front and, consequently, the pn-junction is advanced into the intermediate layer 3 which is doped with arsenic.

The invention provides the advantage that by the use of arsenic with its low diffusion coefficient, the relatively highly-doped intermediate layer 3 is prevented from advancing into the weakly doped surface layer 4 during the planar diffusion which is actually the case when using phosphorus. The steam pressure of the arsenic which is relatively high with respect to antimony has no disturbing effect during the diffusion process in the course of manufacturing the semiconductor device according to the present invention, because the intermediate layer 3 which is doped with arsenic, is enclosed on all sides by layers not doped with arsenic. A further advantage of the semiconductor device according to the present invention resides in the fact that with the high doping concentrations in the base body which are achievable with phosphorus, it is possible to achieve a very low series resistance.

Semiconductor devices according to the present invention can also be manufactured in that there is started out from a thin slice doped with arsenic, acting as an intermediate layer, for serving as the substrate. On to this substrate there is deposited on either side, by way of epitaxy, both the base body 5 and the surface layer 4.

The idea of invention as explained hereinbefore can be applied in all cases successfully, where uniform doping concentrations throughout the pn-junction areas and, consequently, uniform break-down voltages, or also as small as possible scatterings of the break-down voltages of individual elements of a semiconductor wafer are diesirable. Accordingly, the idea of invention, if so required, may also be applied to transistors, thyristors, or pn-switching diodes.

I claim:

1. A semiconductor device having a mono-crystalline body comprising:
   - a substrate of n conductivity type material of one resistivity, said substrate being doped with phosphorus;
   - an intermediate layer of n conductivity type material of a higher resistivity than said substrate, one surface of said layer being attached to one surface of said substrate, said intermediate layer being doped with arsenic;

- a surface layer of n conductivity type material attached to the opposite surface of said intermediate layer, said surface layer having a higher resistivity than said intermediate layer; and
   - a p doped surface zone extending through said surface layer into said intermediate layer forming an areal pn-junction therein, whereby voltage break-down occurs at the barrier layer area of the pn-junction within said intermediate layer.

2. A semiconductor device having a mono-crystalline body according to claim 1, wherein said intermediate layer is an epitaxial layer on said phosphorus doped substrate.

3. A semiconductor device having a mono-crystalline body according to claim 1, wherein said substrate and said surface layer are epitaxial layers on said intermediate layer.

References Cited

UNITED STATES PATENTS

| | | | |
|---|---|---|---|
| 3,028,529 | 4/1962 | Belmont et al. ______ | 317—234 |
| 3,277,351 | 10/1966 | Osafune et al. ______ | 317—234 |
| 3,411,053 | 11/1968 | Wiesner ____________ | 317—235 |

JAMES D. KALLAM, Primary Examiner

U.S. Cl. X.R.

317—235